US009028726B2

(12) United States Patent
Ikisawa et al.

(10) Patent No.: US 9,028,726 B2
(45) Date of Patent: May 12, 2015

(54) OXIDE SINTERED COMPACT FOR PRODUCING TRANSPARENT CONDUCTIVE FILM

(75) Inventors: Masakatsu Ikisawa, Ibaraki (JP); Masataka Yahagi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1057 days.

(21) Appl. No.: 13/063,141

(22) PCT Filed: Sep. 18, 2009

(86) PCT No.: PCT/JP2009/066391
§ 371 (c)(1),
(2), (4) Date: Mar. 9, 2011

(87) PCT Pub. No.: WO2010/035715
PCT Pub. Date: Apr. 1, 2010

(65) Prior Publication Data
US 2011/0163279 A1    Jul. 7, 2011

(30) Foreign Application Priority Data
Sep. 25, 2008  (JP) ................................ 2008-246468

(51) Int. Cl.
| H01B 1/00 | (2006.01) |
| H01B 1/02 | (2006.01) |
| H01B 1/12 | (2006.01) |
| C22C 28/00 | (2006.01) |
| C01B 13/14 | (2006.01) |
| C01B 13/00 | (2006.01) |
| C01F 11/02 | (2006.01) |
| C01F 7/00 | (2006.01) |
| C01G 45/12 | (2006.01) |
| C01G 53/04 | (2006.01) |
| C01G 17/02 | (2006.01) |
| C01G 19/02 | (2006.01) |
| C23C 14/34 | (2006.01) |
| C04B 35/01 | (2006.01) |
| C04B 35/457 | (2006.01) |
| C04B 35/626 | (2006.01) |
| C23C 14/08 | (2006.01) |

(52) U.S. Cl.
CPC ............. *C23C 14/3414* (2013.01); *C04B 35/01* (2013.01); *C04B 35/457* (2013.01); *C04B 35/6263* (2013.01); *C04B 35/62635* (2013.01); *C04B 35/62695* (2013.01); *C04B 2235/3217* (2013.01); *C04B 2235/3262* (2013.01); *C04B 2235/3279* (2013.01); *C04B 2235/3284* (2013.01); *C04B 2235/3286* (2013.01); *C04B 2235/3287* (2013.01); *C04B 2235/3293* (2013.01); *C04B 2235/5445* (2013.01); *C04B 2235/604* (2013.01); *C04B 2235/6562* (2013.01); *C23C 14/086* (2013.01)

(58) Field of Classification Search
CPC .................. C04B 35/01; C04B 35/457; C04B 2235/3217; C04B 2235/3279; C04B 2235/3286; C04B 2235/3293; C04B 2235/3262; C04B 2235/3287; H01B 1/02; H01B 1/08
USPC ....................... 252/500, 520.1, 520.21, 521.2; 423/592.1, 593.1, 594.3, 594.4, 594.9, 423/594.16, 599, 600; 420/555
See application file for complete search history.

(56) References Cited

U.S. PATENT DOCUMENTS

| 5,433,901 | A | 7/1995 | Rancoule et al. ............... 264/28 |
| 2008/0014452 | A1 | 1/2008 | Yasuda ......................... 428/469 |

FOREIGN PATENT DOCUMENTS

| CN | 1957425 | A |   | 5/2007 | ............... H01B 1/20 |
| FR | 2 683 219 |   |   | 10/1991 | ............... C03C 17/23 |
| JP | 3-71510 | A |   | 3/1991 | |
| JP | 3-78907 | A |   | 4/1991 | |
| JP | 05098436 |   |   | 4/1993 | ............... C23C 14/34 |
| JP | 07054135 | A | * | 2/1995 | ............... C23C 14/34 |
| JP | 7-161235 | A |   | 6/1995 | |
| JP | 07161235 |   | * | 6/1995 | |
| JP | 8-199343 | A |   | 8/1996 | |
| JP | 09152940 |   |   | 6/1997 | ............... G06F 3/033 |
| JP | 11-323531 |   |   | 11/1999 | ............... C23C 14/08 |
| JP | 2000054115 |   | * | 2/2000 | |

(Continued)

OTHER PUBLICATIONS

Supplementary European Search Report from European from European Application No. 09816131.8 dated Apr. 24, 2012.

(Continued)

*Primary Examiner* — Harold Pyon
*Assistant Examiner* — Tanisha Diggs
(74) *Attorney, Agent, or Firm* — Drinker Biddle & Reath LLP

(57) ABSTRACT

The present invention provides a sputtering target suitable for producing an amorphous transparent conductive film which can be formed without heating a substrate and without feeding water during the sputtering; which is easily crystallized by low-temperature annealing; and which has low resistivity after the crystallization. An oxide sintered compact containing an indium oxide as a main component, while containing tin as a first additive element, and one or more elements selected from germanium, nickel, manganese, and aluminum as a second additive element, with the content of tin which is the first additive element being 2-15 atom % relative to the total content of indium and tin, and the total content of the second additive element being 0.1-2 atom % relative to the total content of indium, tin and the second additive element.

8 Claims, No Drawings

(56) References Cited

FOREIGN PATENT DOCUMENTS

| | | | | |
|---|---|---|---|---|
| JP | 2000169200 | | 6/2000 | ............ C04B 35/457 |
| JP | 2000169220 | | 6/2000 | ............ C04B 35/457 |
| JP | 2000169220 A | * | 6/2000 | ............ C04B 35/457 |
| JP | 2002050231 | | 2/2002 | ............... H01B 5/14 |
| JP | 2002053952 | | 2/2002 | ............... C23C 14/34 |
| JP | 2003-105532 A | | 4/2003 | |
| JP | 2003-239063 A | | 8/2003 | |
| JP | 3496239 B2 | | 11/2003 | |
| JP | 2003342068 | | 12/2003 | ............ C04B 35/495 |
| JP | 2004-006221 | | 1/2004 | ............... H01B 5/14 |
| JP | 2004-087451 | | 3/2004 | ............... H01B 5/14 |
| JP | 2004-241296 A | | 8/2004 | |
| JP | 2004-339607 A | | 12/2004 | |
| JP | 3780100 B2 | | 3/2006 | |
| JP | 2007-115431 A | | 5/2007 | |
| JP | 2008115024 | * | 5/2008 | |
| KR | 20090000890 | * | 1/2009 | |
| WO | 2006/070715 A1 | | 7/2006 | |

OTHER PUBLICATIONS

Office action mailed Dec. 11, 2012 in U.S. Appl. No. 13/063,151.

International Preliminary Report on Patentability for PCT/JP2009/066391, dated Apr. 28, 2011.

Nishimura E., et al. " Microstructures of ITO films deposited by d.c. magnetron sputtering with $H_2O$ introduction" International Journal on the Science and Technology of Condensed Matter Films, Thin Solid Films 445:2, pp. 235-240 (2003).

* cited by examiner

OXIDE SINTERED COMPACT FOR PRODUCING TRANSPARENT CONDUCTIVE FILM

This is an application filed under 35 U.S.C. 371 of PCT/JP2009/066391, filed Sep. 18, 2009, which claims benefit from Japan Application 2008246468, filed Sep. 25, 2008.

BACKGROUND OF THE INVENTION

1. Field of the Invention

The present invention relates to oxide sintered compact for preparing a transparent conductive film formed as an electrode in a flat panel display or the like. It also relates to a transparent conductive film obtained by using said oxide sintered compact as a sputtering target and a method for preparing the same.

2. Description of the Related Art

An ITO (Indium Tin Oxide) film is characterized in low resistivity and high transmission factor, and can be microfabricated easily. Since these characteristics are superior in comparison to other transparent conductive films, an ITO film is being broadly used in various fields including for use as a display electrode in a flat panel display. The deposition method of the ITO film in today's industrial production process is mostly based on the so-called sputter deposition method of performing sputtering using an ITO sintered compact as the target since the ITO film can be uniformly formed on a large area with favorable productivity.

In a flat panel display manufacture process using an ITO transparent conductive film, the crystallinity of the ITO film immediately after the sputtering is amorphous, and, in many cases, microfabrication such as etching is performed with the ITO film in an amorphous state, and thermal annealing is subsequently performed to crystallize the ITO film. This is because an ITO amorphous film is advantageous in terms of productivity due to much higher etching rate than an ITO crystalline film, while the ITO crystal film is superior in low resistivity, and both advantages can thereby be enjoyed.

Although most part of the film obtained by sputtering the ITO target is amorphous, in many cases a part of the film becomes crystallized. The reason for this is that although most part of the film remains amorphous since the temperature will become no more than 150° C., which is approximate to the crystallization temperature of the ITO film, particles that come flying to the substrate by sputtering sometimes have a high energy level and the temperature of the film becomes so high as to exceed the crystallization temperature due to the transfer of energy after the particles arrive at the substrate, resulting in crystallization of a part of the film.

If a part of the ITO film becomes crystallized in this way, such crystallized portion will remain as so-called etching residue in the subsequent etching process, and cause problems such as a short circuit, since the etching rate of that part will be lower than that of an amorphous portion by roughly two orders of magnitude.

In light of the above, it is known that the addition of water ($H_2O$) in addition to sputter gas such as argon in a chamber during sputtering is effective as a method of preventing the crystallization of the sputtered film and amorphizing the entire sputtered film (for example, refer to Non-Patent Document 1).

Nevertheless, the method of adding water when sputtering to obtain an amorphous film entails numerous problems. Foremost, in many cases particles are generated on the sputtered film. These particles have an adverse effect on the flatness and crystallinity of the sputtered film. Since particles will not be generated if water is not added, the problem of generation of particles is caused by adding water.

In addition, even if the water concentration in the sputtering chamber is initially adequate, the concentration will gradually fall below the adequate concentration, and a part of the sputtered film will become crystallized, since it gradually decreases during the lapse of the sputtering time.

On the other hand, however, if the concentration of the water to be added is increased in order to reliably obtain an amorphous sputtered film, the crystallization temperature for crystallizing the film in the subsequent annealing process will become extremely high, causing a problem that the resistivity of the obtained film will become extremely high.

In other words, if sputtering is performed with adding water to amorphize the entire sputtered film, it is necessary to constantly monitor and control the water concentration within the chamber, however, this is extremely difficult and requires considerable time and effort.

In order to overcome the foregoing problems, a transparent conductive material which is stably amorphous is partly used in substitute for an ITO film which readily becomes crystallized. For instance, it is known that an amorphous film can be obtained by sputtering a target having a composition of indium oxide and an added amount of zinc, but the sputtered films obtained thereby are very stably amorphous, and 500° C. or more is necessary to crystallize them.

Therefore, the advantage on the process by crystallizing the film in order to significantly lower the etching rate cannot be obtained, and thus the resistivity of the sputtered film obtained is approximately 0.5 mΩ cm, which is higher than the crystallized ITO film. Moreover, the visible light average transmission factor of this film is roughly 85%, and is inferior to that of ITO film.

As prior art disclosing that amorphous films can be obtained without adding water and/or zinc, the following are referred to.

Patent Document 1 teaches "A transparent conductive film predominantly comprising of the oxide of In, furthermore containing Ge, or Ge and Sn can be amorphous, and thereby is easy to be etched and excellent in workability." (Paragraph 0015). This is because that "under certain film forming conditions, adding Ge is effective for amorphizing $In_2O_3$ film and said addition does not have any bad influence upon the electric resistivity and transmission factor." (Paragraph 0021). Such film forming conditions are that "the film forming temperature is adjusted to 100-300° C., and 2-12 atomic percent of Ge is added based on the total amount of Ge and In, and the oxygen partial pressure is kept at 0.02 mTorr or more when the film is formed" (Paragraph 0029). It is also described that "During the formation of the film, if the film forming temperature is below 100° C., and the amount of Ge added is less than 2 atomic percent, reduction of the electric resistivity due to carrier electron release by Ge is not sufficient, and therefore the electric resistivity is more than 0.01 Ω cm" (Paragraph 0030).

However, the Patent Document 1 describes only about obtaining an amorphous film, and thus crystallization of the amorphous films obtained is not considered at all.

Patent Document 2 discloses "the transparent conductive thin film containing indium oxide as a main ingredient and further containing at least one selected from W, Si, and Ge stably provides films with excellent surface smoothness and amorphous structure. The amorphous film is crystallized through heating to obtain a low resistivity of $9 \times 10^{-4}$ Ω cm or less while kiiping the surface smoothness, and furthermore a high visible light transmission factor is obtained (Paragraph 0024). The Patent Document 1 indicates that when one or more selected from W, Si, and Ge is(are) added as a first additive element to indium oxide or indium tin oxide, the amorphousness and surface smoothness of the films may be realized. The content of the first additive elements is adjusted to 0.2-15 atomic percent based on the total amount of In and the first additive elements. Further, it is described that the amorphous transparent conductive thin films are crystallized while keeping its excellent surface smoothness by heating treatment over the crystallization temperature and thereby the specific resistivity may be reduced.

Patent Document 2 discloses that the amorphous film is prepared and then crystallized. However, it only discloses an example where W is added and does not disclose any other examples where any one of the other elements is solely added. Therefore, it is not clear whether other elements such as Ge may accomplish the same effect as that of W. Further, in Examples, the heat treatment temperature for crystallization is as high as 300-400° C.

In addition, there is prior art for improving the properties by adding various elements into the sputtering target.

Patent Document 3 discloses a target containing an insulating oxide in addition to indium oxide or indium tin oxide, in order to provide an indium oxide system sputtering target for the highly resistant transparent conductive film with the resistivity of about $0.8-10 \times 10^{-3} \Omega$ cm. As one example of an insulating oxide, manganese oxide is mentioned. However, Patent Document 3 does not describe any sputtering targets for obtaining a low resistant conductive film.

Patent Document 4 discloses a target adding Mn to indium oxide or indium tin oxide since Mn containing in the sintered compact made of indium oxide and tin oxide will enable an extremely high sintered density. It is described that the content of Mn is adjusted to 5 to 5000 ppm Mn in the ITO sintered body finally obtained. The content of Mn is preferably 10~5000 ppm. In Examples, it was added 500 ppm at most.

Patent Document 5 discloses that resistivity of a transparent conductive film reduces by adding manganese oxide into indium oxide. According to the document, when 2-15 mol % of manganese oxide is added, the film has preferably resistivity of less than $2 \times 10^{-4} \Omega$ cm.

Patent Document 6 describes a transparent conductive film which is mainly comprised of indium oxide and tin oxide, and includes an oxide of at least one metal selected from the group consisting of magnesium and nickel. In this way, the film becomes fine, increasing electron mobility to about $1.5 \times 10$ $cm^2 \cdot s^{-1} \cdot V^{-1}$. Further, Document 1 also discloses that resistance to humidity and ultraviolet rays can be improved by optimizing the ratio of magnesium or nickel. Document 1 teaches that a formulating proportion of magnesium compound or nickel compound to indium compound in terms of the formula represented by M/(M+In) (M is nickel or magnesium, and In is indium) is preferably 0.05 or less.

Patent Document 7 discloses that specific resistance of a transparent conductive film is reduced by adding nickel oxide to indium oxide. The amount of nickel oxide to be added is preferably defined as 2-25 mol % to achieve the specific resistance of $2 \times 10^{-4} \Omega$ cm or less.

Patent Document 8 discloses a film comprised of indium oxide and further containing trivalent cation, an example thereof being aluminum. Patent Document 8 teaches that a transparent conductive film having lower resistance and improved etching workability is thus obtained.

[Prior Art Documents]
<Patent Document>
Patent Document 1: JP 3780100B
Patent Document 2: JP 2004-241296A
Patent Document 3: JP2003-105532A
Patent Document 4: JP 3496239B
Patent Document 5: JP H03-78907A
Patent Document 6: H07-161235A
Patent Document 7: H03-71510A
Patent Document 8: H08-199343A
<Non-Patent Document>
Non-Patent Document 1: Thin Solid Films 445 (2003) p 235-240

SUMMARY OF THE INVENTION

Problems to be Solved by the Present Invention

None of the prior arts disclose an amorphous transparent conductive film which can be formed without heating a substrate and without feeding water during the sputtering; which is easily crystallized by low-temperature annealing; and which has low resistivity after the crystallization. Further, a sputtering target suitable for producing such an amorphous transparent conductive film also has not yet been disclosed. If such an amorphous transparent conductive film is obtained, it will be industrially useful, and it will also be economically advantageous.

Thus, one of the main problems to be solved by the present invention is to provide a sputtering target which makes it possible to produce such an amorphous transparent conductive film Another one of the main problems to be solved by the present invention is to provide such an amorphous transparent conductive film.

Means for Solving the Problem

As a result of intense study regarding an oxide sintered compact obtained by adding various elements to ITO, the present inventors have found that by using, as a sputtering target, an oxide sintered compact in which the type(s) and proportion of dopant(s) are properly selected, an amorphous transparent conductive film which is easily crystallized by low-temperature annealing and has remarkably low resistivity after the crystallization can be obtained.

The present invention may be specified, on the basis of such findings, as described below.

1) An oxide sintered compact containing an indium oxide as a main component, while containing tin as a first additive element, and one or more elements selected from germanium, nickel, manganese, and aluminum as a second additive element, with the content of tin which is the first additive element being 2-15 atom % relative to the total content of indium and tin, and the total content of the second additive element being 0.1-2 atom % relative to the total content of indium, tin and the second additive element.

2) An oxide sintered compact containing an indium oxide as a main component, while containing tin as a first additive element, one or more elements selected from germanium, nickel, manganese, and aluminum as a second additive element, and one or more elements selected from magnesium and calcium as a third additive element, with the content of tin which is the first additive element being 2-15 atom % relative to the total content of indium and tin, and the total content of the second additive element and the third additive element being 0.1-2 atom % relative to the total content of indium, tin, the second additive element and the third additive element.

3) A method of producing an amorphous film, wherein the oxide sintered compact according to 1) or 2) above is used as a sputtering target and is sputtered.

4) An amorphous film having the same composition as that of the oxide sintered compact according to 1) or 2) above.
5) A method of producing a crystallized film, wherein the amorphous film according to 4) above is crystallized by annealing at a temperature of 160-250° C.
6) A crystallized film having the same composition as that of the oxide sintered compact according to 1) or 2) above.
7) A crystallized film according to 6) having resistivity of less than $4.5 \times 10^{-4} \Omega$ cm.

The first feature of the present invention is that the added elements such as germanium prevent from crystallization through the effect of disconnecting the ITO network coupling structure. If the aim is to simply prevent crystallization of the ITO film, such aim can be achieved by increasing the additive concentration by a great degree.

Nevertheless, in the foregoing case, it is not possible to yield the second feature of the present invention of crystallizing the film by annealing at a low temperature after deposition, and achieving low resistivity of the crystallized film. This is because if the additive element concentration is set high, the temperature for crystallization will rise and resistivity of the crystallized film will also rise.

In other words, the technical contribution of the present invention lies in that it enables to realize achievement of amorphization of the sputtering film during deposition as well as crystallization by subsequent annealing at a low temperature and low resistivity of the film.

Effect of the Invention

According to the present invention, by using as a sputtering target oxide sintered compact obtained by adding an adequate concentration of the added elements such as germanium to ITO in sputter deposition under prescribed conditions, it is possible to obtain a film which is entirely amorphous. Moreover, this film is able to enjoy the advantages of an ITO amorphous film which will not encounter any problem of etching residue in the subsequent etching process and the etching rate is faster by roughly two orders of magnitude in comparison to a crystalline ITO film. Moreover, it is able to yield an extremely superior effect such as the advantage of crystallizing the film by annealing at a temperature that is not too high after deposition and attaining lower resistivity of the crystallized film.

DETAILED DESCRIPTION OF THE EMBODIMENT OF THE INVENTION

Composition of the Oxide Sintered Compact and the Transparent Conductive Film

When tin is added as the first additive element to indium oxide, it works as an n-type donor and yields the effect of lowering the resistivity. In a commercially available ITO target and the like, the tin concentration (Sn) is normally about 10 atom % relative to the total amount of the indium and the tin. If the tin concentration is too low, the electron donation will be small. Contrarily, if the tin concentration is too high, it will become electron scattered impurities. In both cases, the resistivity of the film obtained by sputtering will become high. Accordingly, the appropriate range of the tin concentration for an ITO is 2-15 atom % relative to the total amount of the indium and the tin, and preferably, 8-12 atom %.

Germanium, manganese, nickel, and aluminum as the second additive element have an amorphizing effect by inhibiting the crystallization of films when added to ITO. The additive element may be solely added or two or more elements may be added. However, when the total content of the second additive element is too small relative to the total content of indium, tin and the second additive element, there will hardly be any effect of amorphizing the film, and a part of the sputtered film will become crystallized. Contrarily, in case where the total content of the second additive element is too much relative to the total content of indium, tin and the second additive element, the annealing temperature required to crystallize the amorphous film obtained by sputtering will become a high temperature exceeding 250° C., which is unsuitable in terms of productivity since much cost, labor and time will be spent for implementing such process. Moreover, if the second additive element concentration is too high, even if the film is crystallized by annealing at a high temperature, the resistivity of the obtained film will be high, and this will be a significant drawback from the perspective of conductivity of the transparent conductive film.

Therefore, the total content of the second additive element is 0.1-2 atom %, preferably, 0.5-1 atom % relative to the total content of the indium, the tin and the second additive elements.

Among the second additive elements, germanium is preferable. This is because germanium has an increased effect of lowering the crystallization temperature in comparison to the other second additive elements, and also has an increased effect of reducing the resistivity of the crystallized film.

Magnesium and calcium can also be added, as the third additive element, to ITO together with the second additive element, since the third additive element also contribute to the amorphization of the film in the same way as the second additive element. In this case, when the total content of the second additive element and the third additive element is too small relative to the total amount of indium, tin, the second additive element and the third additive element, the effect of amorphizing the film becomes inadequate, and therefore, the crystallization temperature is low and a part of the sputtered film will become crystallized, and thus, such crystallized portion will disadvantageously remain as etching residue in the etching process. Contrarily, in case where the total content of the second additive element and the third additive element is too much relative to the total content of indium, tin, the second additive element and the third additive element, the effect of amorphizing the film is too strong, and therefore, high temperature is required for crystallization and the resistivity of the crystallized film will disadvantageously increase.

Therefore, the total content of the second additive element and the third additive element is 0.1-2 atom %, preferably 0.3-1 atom %, relative to the total content of indium, tin, the second additive element and the third additive element.

Incidentally, to the oxide sintered compact or the transparent conductive thin film of the present invention, in addition to the above-described additive elements, impurity elements such as Ag, Cu, Au, Pt, Pd, Ir, Re, Os, Ru, Ti, Mo, Hf, and Ce may be contained within the range where they are harmless for the purpose of the present invention.

The Method of Producing the Oxide Sintered Compact

The suitable method of producing the oxide sintered compact related to the present invention is now explained.

In order to produce the oxide sintered compact of the present invention, foremost, an indium oxide powder, a tin oxide powder, an oxide powder of the second additive element and, if necessary, an oxide powder of the third additive elements as the raw materials are weighed and mixed at a prescribed ratio. Insufficient mixing will cause a high resistivity area and a low resistivity area in the produced target where the second additive element or the third additive element is segregated and abnormal discharge such as arcing due to electrification in the high resistivity area will occur easily during the sputter deposition. Although the raw materials which is non-oxide form may be used, oxide is preferable in view of handling.

Thus, it is desirable to perform sufficient mixing for roughly 2 to 5 minutes at a high speed of 2000 to 4000 rotations per minute using a super mixer. Incidentally, since the raw material powder is oxide, the atmospheric gas may be air since there is no need to give special consideration for preventing the oxidation of the raw material.

At this stage, it is also effective to introduce a calcination process of retaining the raw material in an atmospheric environment at 1250 to 1350° C. for 4 to 6 hours in order to promote solid solution among the raw materials. Calcination may be performed to a mixed powder of the indium oxide and the oxide of the second additive element and/or third additive element, or a mixed powder of the tin oxide and the oxide of the second additive element and/or the third additive element.

The mixed powder is subsequently pulverized, aiming to uniformly distribute the raw material powder in the target. Raw material with a large grain size means that there is variation in the composition depending on the location. Especially, germanium oxide has insulating properties, and therefore, it will cause abnormal discharge during the sputter deposition. Further, there will be variation in the effect by the second additive element which prevent from crystallization. It will cause the crystallization of ITO in the region where the concentration of the second additive element is low.

Accordingly, pulverization is desirably performed until the average grain size (D50) of the raw material powder gets 1 μm or less, preferably 0.6 μm or less. In reality, water is added to the mixed powder to obtain slurry with the solid content of 40 to 60wt %, and pulverization is performed with zirconia beads having a diameter of 1 mm for roughly 1.5 to 3.0 hours.

Granulation of the mixed powder is subsequently performed. Granulation is performed to improve the fluidity of the raw material powder and to make the filling state of such raw material powder during the press molding sufficiently favorable. PVA (polyvinyl alcohol) that acts as a binder is mixed at a ratio of 100 to 200 cc per kilogram of slurry, and the mixed powder is granulated under the conditions where the granulator's inlet temperature is 200 to 250° C., outlet temperature is 100 to 150° C., and disk rotation is 8000 to 10000 rpm.

Press molding is subsequently performed. Granulated powder is filled in a mold of a prescribed size at a surface pressure of 700 to 900 kgf/cm$^2$ to obtain a compact. If the surface pressure is 7 less than 00 kgf/cm$^2$, it is not possible to obtain a compact having sufficient density. The surface pressure of more than 900 kgf/cm$^2$ is not necessary and this is undesirable in terms of productivity since it will also require wasteful cost and energy.

Sintering is ultimately performed. The sintering temperature is 1450 to 1600° C., the retention time is 4 to 10 hours, the temperature increase rate is 4 to 6° C./minute, and cooling is performed with furnace cooling. If the sintering temperature is lower than 1450° C., the density of the sintered compact will be insufficient, and if the sintering temperature exceeds 1600° C., it will shorten the life of the furnace heater. If the retention time is shorter than 4 hours, the reaction among the raw material powders will not advance sufficiently, and the density of the sintered compact will be insufficient. If the sintering time exceeds 10 hours, since the reaction is already sufficient, this is undesirable from the perspective of productivity since energy and time will be wasted.

If the temperature increase rate is less than 4° C./minute, much time will be required in attaining a prescribed temperature. Meanwhile, if the rate of temperature increase is greater than 6° C./minute, the temperature will not rise with a uniform temperature distribution within the furnace, and there will be unevenness. The relative density of the sintered compact obtained as described above will be 98-100% e.g., approximately 99.9% and the bulk resistance will be about 0.1-3.0 mΩ cm e.g., approximately 0.13 mΩ cm.

The Method of Producing the Sputtering Target

The method of producing the sputtering target is explained below.

The oxide sintered compact obtained under the foregoing manufacturing conditions can be subjected to cylindrical grinding of the outer periphery side and surface grinding of the circular surface to be processed into a size having a thickness of roughly 4 to 6 mm and a diameter to fit the sputtering device. Then, it can be laminated to a backing plate made of copper using a bonding metal such as indium alloy to obtain a sputtering target.

The sputtering deposition method is explained below.

The transparent conductive film of the present invention can be obtained by using the sputtering target of the present invention to perform sputter deposition with an argon gas pressure of 0.4 to 0.8 Pa, spacing between the target and the substrate at 50 to 110 mm, using glass or the like as the substrate without heating the substrate, and a sputtering power (e.g. for the target size of 8 inches) of 200 to 900 W. Sputter type is preferably DC magnetron sputter.

If the spacing between the target and the substrate is shorter than 50 mm, the kinetic energy of the particles of the constituent elements of the target that reach the substrate will become too large and cause substantial damage to the substrate, whereby the film resistivity will increase and a part of the film may become crystallized. Meanwhile, if the spacing between the target and the substrate is longer than 110 mm, the kinetic energy of the particles of the constituent elements of the target that reach the substrate will become too small, whereby a dense film cannot be formed and the resistivity will become high. The adequate range of the argon gas pressure and the sputtering power is defined as described above for similar reasons. Moreover, if the substrate is heated, the film tends to crystallize easily. Accordingly, the obtained film will become amorphous by adequately selecting the foregoing sputtering conditions.

The Method of Evaluating the Characteristics of the Film

The method of evaluating the characteristics of the film is now explained.

The determination of crystallinity of the transparent conductive film obtained as described above can be confirmed based on the existence of a peak appeared with a crystalline film in the X-ray diffraction measurement (XRD measurement) of the film and whether there is etching residue appeared in case of a crystalline film after the etching of the film with oxalic acid. In other words, if there is no peak that is unique to ITO crystals in the X-ray diffraction measurement and there is no etching residue, then that film can be determined to be amorphous.

The etching method of the film using oxalic acid can be performed, for instance, by using as an etchant a solution obtained by mixing oxalic acid dihydrate $(COOH)_2 \cdot 2H_2O$ and purified water at a weight ratio of oxalic acid:purified water=5:95, placing in a constant temperature bath so as to maintain the liquid temperature at 40° C., and stirring the film-attached substrate.

Further, the resistivity of the film can be obtained by Hall measurement.

The Annealing Method of the Film

The annealing method of the film is now explained.

In order to crystallize the amorphous film obtained as described above, for example, crystallization can be achieved by performing annealing at a temperature of 160 to 250° C., and higher than the crystallization temperature of amorphous films, for 30 to 60 minutes under a nitrogen atmosphere, although the condition will vary slightly depending on the additive element. A preferable amorphous film can be crystallized at 200° C. or less. The crystallization of the film can be confirmed from the peak intensity becoming extremely strong in the XRD measurement or from the decrease of the etching rate in the etching of the film using oxalic acid by roughly two orders of magnitude in comparison to the amorphous film.

In addition, the crystallized film is able to realize low resistivity of less than $4.5 \times 10^{-4} \Omega$ cm, preferably $4.0 \times 10^{-4} \Omega$ cm or lower, more preferably $3.5 \times 10^{-4} \Omega$ cm or lower, since the electron ejection effect by tin is carried out sufficiently and both the carrier concentration and mobility will increase, although the resistivity will vary slightly depending on the additive element concentration.

EXAMPLES

The present invention is now explained in detail with reference to the Examples. These Examples are merely illustrative, and the present invention shall in no way be limited thereby. In other words, various modifications and other embodiments whithin the technical spirit in the claims shall be included in the present invention.

Example 1

Indium oxide ($In_2O_3$) powder, tin oxide ($SnO_2$) powder and germanium oxide ($GeO_2$) powder, as the raw materials were weighed to achieve In:Sn:Ge=89.91:9.99:0.1 based on the atomicity ratio, and mixed with a super mixer in an atmospheric environment for 3 minutes at 3000 rotations per minute.

Subsequently, water was added to the mixed powder to obtain slurry with the solid content of 50%, and the slurry was pulverized with zirconia beads having a diameter of 1 mm for 2 hours to achieve an average grain size (D50) of the mixed powder of 0.6 μm or less. PVA (polyvinyl alcohol) was thereafter mixed at a ratio of 125 cc per kilogram of slurry, and granulated under the conditions where the granulator's inlet temperature was 220° C., outlet temperature was 120° C., and disk rotation was 9000 rpm.

Subsequently, granulated powder was filled in a mold of a prescribed size to obtain a target having an 8-inch diameter, and pressed at a surface pressure of 780 kgfcm² to obtain a compact. The compact was sintered by heating up to 1540° C. at a temperature increase rate of 5° C./minute, retaining for 5 hours at 1540° C., and cooling by furnace cooling.

The oxide sintered compact obtained under the foregoing conditions was subjected to cylindrical grinding of the outer periphery side and surface grinding of the circular surface to realize a thickness of roughly 5 mm and a diameter of 8 inches. Then, it was laminated to a backing plate made of copper using indium as a bonding metal to obtain a sputtering target.

The foregoing sputtering target was equipped to SPF-313H sputtering device (Canon-anelva.co.) and used to perform DC magnetron sputter deposition with an argon gas pressure of 0.5 Pa, spacing between the target and the substrate at 80 mm, using non-alkali glass as the substrate, and, with the substrate in a non-heated state, and sputtering power of 785 W and deposition time of 22 seconds in order to obtain a film having a film thickness of approximately 550 Å. As a result of conducting XRD measurement of the foregoing film, a peak showing crystallinity could not be acknowledged. The film was amorphous.

Moreover, the film was subjected to etching using as an etchant a solution obtained by mixing oxalic acid and purified water at a weight ratio of oxalic acid:purified water=5:95, but no etching residue was acknowledged.

The foregoing amorphous film was annealed under a nitrogen atmosphere at the respective temperatures of 130 to 250° C. for 60 minutes at 10° C. intervals, and the XRD measurement, resistivity of the annealed film were measured. Pursuant to the increase in the annealing temperature, the peak intensity in the XRD measurement gradually became larger, but the peak intensity suddenly increased from a certain temperature, and subsequently became stable. Moreover, pursuant to the increase in the annealing temperature, the film resistivity gradually decreased, but the film resistivity suddenly decreased from a certain temperature, and subsequently became stable. The transparency of the film was kept before and after the annealing.

Both of the foregoing temperatures were roughly the same, and the temperature in which the peak intensity and resistivity start to stabilize was determined to be the crystallization temperature of the film.

The crystallization temperature of this film was 170° C., and the resistivity of the crystallized film was 0.25 mΩ cm. These results are shown in Table 1. Moreover, the transmission factor at a wavelength of 550 nm was 90%.

TABLE 1

| | Sintered compact comp. (atomic %) | | | | | | | | | Rate (Atom %) | | Resistivity (mΩcm) | Crystallization temp. (° C.) |
|---|---|---|---|---|---|---|---|---|---|---|---|---|---|
| | In | Ge | Ni | Mn | Al | Sn | Mg | Ca | Zn | A | B | | |
| Ex. 1 | 89.91 | 0.1 | 0.0 | 0.0 | 0.0 | 9.99 | 0.0 | 0.0 | 0.0 | 10.0 | 0.10 | 0.25 | 160 |
| Ex. 2 | 89.55 | 0.5 | 0.0 | 0.0 | 0.0 | 9.95 | 0.0 | 0.0 | 0.0 | 10.0 | 0.50 | 0.30 | 180 |
| Ex. 3 | 89.10 | 1.0 | 0.0 | 0.0 | 0.0 | 9.90 | 0.0 | 0.0 | 0.0 | 10.0 | 1.00 | 0.32 | 200 |
| Ex. 4 | 88.65 | 1.5 | 0.0 | 0.0 | 0.0 | 9.85 | 0.0 | 0.0 | 0.0 | 10.0 | 1.50 | 0.35 | 220 |
| Ex. 5 | 88.20 | 2.0 | 0.0 | 0.0 | 0.0 | 9.80 | 0.0 | 0.0 | 0.0 | 10.0 | 2.00 | 0.39 | 240 |
| Ex. 6 | 89.91 | 0.0 | 0.1 | 0.0 | 0.0 | 9.99 | 0.0 | 0.0 | 0.0 | 10.0 | 0.10 | 0.26 | 160 |
| Ex. 7 | 89.55 | 0.0 | 0.5 | 0.0 | 0.0 | 9.95 | 0.0 | 0.0 | 0.0 | 10.0 | 0.50 | 0.31 | 180 |
| Ex. 8 | 89.10 | 0.0 | 1.0 | 0.0 | 0.0 | 9.90 | 0.0 | 0.0 | 0.0 | 10.0 | 1.00 | 0.33 | 200 |
| Ex. 9 | 88.65 | 0.0 | 1.5 | 0.0 | 0.0 | 9.85 | 0.0 | 0.0 | 0.0 | 10.0 | 1.50 | 0.36 | 220 |
| Ex. 10 | 88.20 | 0.0 | 2.0 | 0.0 | 0.0 | 9.80 | 0.0 | 0.0 | 0.0 | 10.0 | 2.00 | 0.40 | 240 |
| Ex. 11 | 89.91 | 0.0 | 0.0 | 0.1 | 0.0 | 9.99 | 0.0 | 0.0 | 0.0 | 10.0 | 0.10 | 0.26 | 160 |
| Ex. 12 | 89.55 | 0.0 | 0.0 | 0.5 | 0.0 | 9.95 | 0.0 | 0.0 | 0.0 | 10.0 | 0.50 | 0.31 | 180 |
| Ex. 13 | 89.10 | 0.0 | 0.0 | 1.0 | 0.0 | 9.90 | 0.0 | 0.0 | 0.0 | 10.0 | 1.00 | 0.33 | 200 |

TABLE 1-continued

|  | Sintered compact comp. (atomic %) | | | | | | | | Rate (Atom %) | | Resistivity (mΩcm) | Crystallization temp. (° C.) |
|---|---|---|---|---|---|---|---|---|---|---|---|---|
|  | In | Ge | Ni | Mn | Al | Sn | Mg | Ca | Zn | A | B | | |
| Ex. 14 | 88.65 | 0.0 | 0.0 | 1.5 | 0.0 | 9.85 | 0.0 | 0.0 | 0.0 | 10.0 | 1.50 | 0.36 | 220 |
| Ex. 15 | 88.20 | 0.0 | 0.0 | 2.0 | 0.0 | 9.80 | 0.0 | 0.0 | 0.0 | 10.0 | 2.00 | 0.40 | 240 |
| Ex. 16 | 89.91 | 0.0 | 0.0 | 0.0 | 0.1 | 9.99 | 0.0 | 0.0 | 0.0 | 10.0 | 0.10 | 0.27 | 160 |
| Ex. 17 | 89.55 | 0.0 | 0.0 | 0.0 | 0.5 | 9.95 | 0.0 | 0.0 | 0.0 | 10.0 | 0.50 | 0.32 | 180 |
| Ex. 18 | 89.10 | 0.0 | 0.0 | 0.0 | 1.0 | 9.90 | 0.0 | 0.0 | 0.0 | 10.0 | 1.00 | 0.34 | 200 |
| Ex. 19 | 88.65 | 0.0 | 0.0 | 0.0 | 1.5 | 9.85 | 0.0 | 0.0 | 0.0 | 10.0 | 1.50 | 0.37 | 220 |
| Ex. 20 | 88.20 | 0.0 | 0.0 | 0.0 | 2.0 | 9.80 | 0.0 | 0.0 | 0.0 | 10.0 | 2.00 | 0.41 | 240 |
| Ex. 21 | 96.90 | 0.1 | 0.0 | 0.0 | 0.0 | 3.00 | 0.0 | 0.0 | 0.0 | 3.0 | 0.10 | 0.32 | 150 |
| Ex. 22 | 96.52 | 0.5 | 0.0 | 0.0 | 0.0 | 2.99 | 0.0 | 0.0 | 0.0 | 3.0 | 0.50 | 0.35 | 170 |
| Ex. 23 | 96.03 | 1.0 | 0.0 | 0.0 | 0.0 | 2.97 | 0.0 | 0.0 | 0.0 | 3.0 | 1.00 | 0.38 | 190 |
| Ex. 24 | 95.55 | 1.5 | 0.0 | 0.0 | 0.0 | 2.96 | 0.0 | 0.0 | 0.0 | 3.0 | 1.50 | 0.40 | 210 |
| Ex. 25 | 95.06 | 2.0 | 0.0 | 0.0 | 0.0 | 2.94 | 0.0 | 0.0 | 0.0 | 3.0 | 2.00 | 0.42 | 230 |
| Ex. 26 | 85.91 | 0.1 | 0.0 | 0.0 | 0.0 | 13.99 | 0.0 | 0.0 | 0.0 | 14.0 | 0.10 | 0.35 | 170 |
| Ex. 27 | 85.57 | 0.5 | 0.0 | 0.0 | 0.0 | 13.93 | 0.0 | 0.0 | 0.0 | 14.0 | 0.50 | 0.38 | 190 |
| Ex. 28 | 85.14 | 1.0 | 0.0 | 0.0 | 0.0 | 13.86 | 0.0 | 0.0 | 0.0 | 14.0 | 1.00 | 0.41 | 210 |
| Ex. 29 | 84.71 | 1.5 | 0.0 | 0.0 | 0.0 | 13.79 | 0.0 | 0.0 | 0.0 | 14.0 | 1.50 | 0.43 | 230 |
| Ex. 30 | 84.28 | 2.0 | 0.0 | 0.0 | 0.0 | 13.72 | 0.0 | 0.0 | 0.0 | 14.0 | 2.00 | 0.45 | 250 |

A: First additive element/(In + First additive element)
B: Second additive element(s)/(In + First additive element + Second additive element(s))

Examples 2-30

The sintered compact composition of Example 1 was changed in Examples 2 to 30, as shown in Table 1, while the other conditions are the same as Example 1. In all of these cases, after deposition, the films were amorphous and transparent and there was no etching residue. After the crystallization, the resistivity of the films reduced sharply in comparison to that in the amorphous state.

From the foregoing results, the crystallinity of the films after deposition was amorphous in all of the Examples. And, although the crystallization temperature gradually increases to a higher temperature pursuant to the increase in the concentration of each dopant, i.e., germanium, nickel, manganese and aluminum, the maximum crystallization temperature was 250° C. at the highest. Thus, a high temperature was not required.

Moreover, although the resistivity of the crystallized film gradually increases pursuant to the increase in the concentration of each dopant, i.e., germanium, nickel, manganese and aluminum, the maximum value was 0.41 mΩ cm at the highest, which is lower than the film in Comparative Example described later in which zinc was added to indium oxide and the resistivity of the film was 0.45 m Ω cm.

Namely, it was revealed that when appropriate concentration of each dopant, i.e., germanium, nickel, manganese and aluminum was added, films were amorphous after deposition, no etching residue remained, the crystallization temperature was low, and the resistivity of the crystallized film dropped sharply after crystallization, resulting in an excellent conductivity.

Examples 31-55

Examples 31-55 are ones in which the sintered compact composition of Example 1 was changed as shown in Table 2, while the other conditions are the same as Example 1. While single dopant was added in Examples 1-30, plural dopants were added in Examples 31-55. As raw materials, nickel oxide (NiO), as a source of Ni, manganese oxide ($Mn_2O_3$), as a source of Mn, aluminum oxide ($Al_2O_3$), as a source of Al, magnesium oxide (MgO), as a source of Mg, and calcium oxide (CaO), as a source of Ca were used, respectively.

TABLE 2

|  | Sintered compact comp. (atomic %) | | | | | | | | | Rate (Atom %) | | Resistivity (mΩcm) | Crystallization temp. (° C.) |
|---|---|---|---|---|---|---|---|---|---|---|---|---|---|
|  | In | Ge | Ni | Mn | Al | Sn | Mg | Ca | Zn | A | C | | |
| Ex. 31 | 89.91 | 0.05 | 0.0 | 0.0 | 0.0 | 9.99 | 0.05 | 0.0 | 0.0 | 10.0 | 0.10 | 0.22 | 170 |
| Ex. 32 | 89.55 | 0.25 | 0.0 | 0.0 | 0.0 | 9.95 | 0.25 | 0.0 | 0.0 | 10.0 | 0.50 | 0.28 | 200 |
| Ex. 33 | 89.10 | 0.50 | 0.0 | 0.0 | 0.0 | 9.90 | 0.50 | 0.0 | 0.0 | 10.0 | 1.00 | 0.30 | 210 |
| Ex. 34 | 88.65 | 0.75 | 0.0 | 0.0 | 0.0 | 9.85 | 0.75 | 0.0 | 0.0 | 10.0 | 1.50 | 0.32 | 230 |
| Ex. 35 | 88.20 | 1.00 | 0.0 | 0.0 | 0.0 | 9.80 | 1.00 | 0.0 | 0.0 | 10.0 | 2.00 | 0.37 | 240 |
| Ex. 36 | 89.91 | 0.05 | 0.0 | 0.0 | 0.0 | 9.99 | 0.0 | 0.05 | 0.0 | 10.0 | 0.10 | 0.32 | 170 |
| Ex. 37 | 89.55 | 0.25 | 0.0 | 0.0 | 0.0 | 9.95 | 0.0 | 0.25 | 0.0 | 10.0 | 0.50 | 0.38 | 200 |
| Ex. 38 | 89.10 | 0.50 | 0.0 | 0.0 | 0.0 | 9.90 | 0.0 | 0.50 | 0.0 | 10.0 | 1.00 | 0.40 | 210 |
| Ex. 39 | 88.65 | 0.75 | 0.0 | 0.0 | 0.0 | 9.85 | 0.0 | 0.75 | 0.0 | 10.0 | 1.50 | 0.42 | 230 |
| Ex. 40 | 88.20 | 1.00 | 0.0 | 0.0 | 0.0 | 9.80 | 0.0 | 1.00 | 0.0 | 10.0 | 2.00 | 0.44 | 240 |
| Ex. 41 | 89.91 | 0.0 | 0.05 | 0.0 | 0.0 | 9.99 | 0.05 | 0.0 | 0.0 | 10.0 | 0.10 | 0.33 | 170 |
| Ex. 42 | 89.55 | 0.0 | 0.25 | 0.0 | 0.0 | 9.95 | 0.25 | 0.0 | 0.0 | 10.0 | 0.50 | 0.39 | 200 |
| Ex. 43 | 89.10 | 0.0 | 0.50 | 0.0 | 0.0 | 9.90 | 0.50 | 0.0 | 0.0 | 10.0 | 1.00 | 0.41 | 210 |
| Ex. 44 | 88.65 | 0.0 | 0.75 | 0.0 | 0.0 | 9.85 | 0.75 | 0.0 | 0.0 | 10.0 | 1.50 | 0.43 | 230 |
| Ex. 45 | 88.20 | 0.0 | 1.00 | 0.0 | 0.0 | 9.80 | 1.00 | 0.0 | 0.0 | 10.0 | 2.00 | 0.44 | 240 |
| Ex. 46 | 89.91 | 0.04 | 0.04 | 0.0 | 0.0 | 9.99 | 0.02 | 0.0 | 0.0 | 10.0 | 0.10 | 0.28 | 170 |
| Ex. 47 | 89.55 | 0.20 | 0.20 | 0.0 | 0.0 | 9.95 | 0.10 | 0.0 | 0.0 | 10.0 | 0.50 | 0.34 | 200 |
| Ex. 48 | 89.10 | 0.40 | 0.40 | 0.0 | 0.0 | 9.90 | 0.20 | 0.0 | 0.0 | 10.0 | 1.00 | 0.36 | 210 |

TABLE 2-continued

| | Sintered compact comp. (atomic %) | | | | | | | | Rate (Atom %) | | Resistivity | Crystallization |
|---|---|---|---|---|---|---|---|---|---|---|---|---|
| | In | Ge | Ni | Mn | Al | Sn | Mg | Ca | Zn | A | C | (mΩcm) | temp. (° C.) |
| Ex. 49 | 88.65 | 0.60 | 0.60 | 0.0 | 0.0 | 9.85 | 0.30 | 0.0 | 0.0 | 10.0 | 1.50 | 0.38 | 230 |
| Ex. 50 | 88.20 | 0.80 | 0.80 | 0.0 | 0.0 | 9.80 | 0.40 | 0.0 | 0.0 | 10.0 | 2.00 | 0.41 | 240 |
| Ex. 51 | 89.91 | 0.02 | 0.0 | 0.0 | 0.0 | 9.99 | 0.04 | 0.04 | 0.0 | 10.0 | 0.10 | 0.27 | 170 |
| Ex. 52 | 89.55 | 0.10 | 0.0 | 0.0 | 0.0 | 9.95 | 0.20 | 0.20 | 0.0 | 10.0 | 0.50 | 0.33 | 200 |
| Ex. 53 | 89.10 | 0.20 | 0.0 | 0.0 | 0.0 | 9.90 | 0.40 | 0.40 | 0.0 | 10.0 | 1.00 | 0.35 | 210 |
| Ex. 54 | 88.65 | 0.30 | 0.0 | 0.0 | 0.0 | 9.85 | 0.60 | 0.60 | 0.0 | 10.0 | 1.50 | 0.37 | 230 |
| Ex. 55 | 88.20 | 0.40 | 0.0 | 0.0 | 0.0 | 9.80 | 0.80 | 0.80 | 0.0 | 10.0 | 2.00 | 0.41 | 240 |

A: First additive element/(In + first additive element)
C: (Second additive element(s) + Third additive element(s))/(In + First additive element + Second additive element(s) + Third additive element(s))

In all of these cases, the films after deposition were amorphous, no etching residue remained, the resistivity of the crystallized film was reduced sharply in comparison to that of the amorphous film.

From the foregoing results, the crystallinity of the deposited film was amorphous in these Examples, and, although the crystallization temperature gradually increases to a higher temperature pursuant to the increase in the total concentration of each dopant, i.e., germanium, nickel manganese and aluminum, the maximum crystallization temperature was 240° C. at the highest. Thus, a high temperature was not required.

Moreover, although the resistivity of the crystallized film gradually increases pursuant to the increase in the total concentration of each dopant, i.e., germanium, nickel manganese and aluminum, the maximum value was 0.44 mΩ cm at the highest, which was lower than the film in Comparative Example described later in which zinc was added to indium oxide and the resistivity of the film was 0.45 mΩ cm.

Namely, it was revealed that when appropriate total concentration of each dopant, i.e., germanium, nickel, manganese and aluminum was added, films were amorphous after deposition, no etching residue remained, the crystallization temperature was low, and the resistivity of the crystallized film dropped sharply after crystallization, resulting in an excellent conductivity.

Further, magnesium and calcium also have the effect of amorphization, etc in the same way as germanium and the like.

Comparative Examples 1-17

Comparative Examples 1-17 are ones in which the sintered compact composition of Example 1 was changed as shown in Table 3, while the other conditions are the same as Example 1.

In Comparative Examples 1 and 2, the concentration of tin was lower than an adequate one, and therefore, the crystallization temperature was too low. Therefore, a portion of the film was crystallized after deposition, and etching residue was generated when etching was performed. Further, the resistivity of the crystallized film was higher than 0.45 mΩ cm, which is the resistivity of the film in which zinc was added to indium oxide.

In Comparative Example 3, while the concentration of tin was within the appropriate range, no dopant was added, and therefore, the crystallization temperature was low. Therefore, a portion of the film was crystallized after deposition, and etching residue was generated when etching was performed.

In Comparative Example 4, the concentration of tin was higher than the appropriate one, and therefore, the resistivity of the crystallized film was higher than 0.45 mΩ cm, which is the resistivity of the film in which zinc was added to indium oxide.

Comparative Example 5 was the film in which zinc was added to indium oxide, which was amorphous after deposition, and was not crystallized at the temperature of 500° C. Further, the resistivity of the film was 0.45 mΩ cm, which is somewhat higher in comparison to that of the crystallized films obtained in the present invention.

In Comparative Examples 6-9, the concentration of each dopant, i.e., germanium, nickel, manganese and aluminum was high. While it is advantageous to be amorphous after the deposition of the film, the crystallization temperature was high, and the resistivity of the crystallized film was also somewhat high.

In Comparative Examples 10-17, the total concentration of each dopant, i.e., germanium, nickel, manganese and aluminum was high. While it is advantageous to be amorphous after the deposition of the film, both of the crystallization temperature and the resistivity of the crystallized film were high.

TABLE 3

| | Sintered compact comp. (atomic %) | | | | | | | | | Rate (Atom %) | | Resistivity | Crystallizaton |
|---|---|---|---|---|---|---|---|---|---|---|---|---|---|
| | In | Ge | Ni | Mn | Al | Sn | Me | Ca | Zn | A | C | (mΩcm) | temp. (° C.) |
| Comp. Ex. 1 | 100.0 | 0.0 | 0.0 | 0.0 | 0.0 | 0.0 | 0.0 | 0.0 | 0.0 | 0.0 | 0.00 | 0.80 | 140 |
| Comp. Ex. 2 | 99.0 | 0.0 | 0.0 | 0.0 | 0.0 | 1.0 | 0.0 | 0.0 | 0.0 | 1.0 | 0.00 | 0.60 | 140 |
| Comp. Ex. 3 | 90.0 | 0.0 | 0.0 | 0.0 | 0.0 | 10.0 | 0.0 | 0.0 | 0.0 | 10.0 | 0.00 | 0.15 | 150 |
| Comp. Ex. 4 | 80.0 | 0.0 | 0.0 | 0.0 | 0.0 | 20.0 | 0.0 | 0.0 | 0.0 | 20.0 | 0.00 | 1.00 | 160 |
| Comp. Ex. 5 | 90.0 | 0.0 | 0.0 | 0.0 | 0.0 | 0.0 | 0.0 | 0.0 | 10.0 | 0.0 | 0.00 | 0.50 | >500 |
| Comp. Ex. 6 | 87.75 | 2.5 | 0.0 | 0.0 | 0.0 | 9.75 | 0.0 | 0.0 | 0.0 | 10.0 | 2.50 | 0.45 | 260 |
| Comp. Ex. 7 | 87.75 | 0.0 | 2.5 | 0.0 | 0.0 | 9.75 | 0.0 | 0.0 | 0.0 | 10.0 | 2.50 | 0.46 | 260 |
| Comp. Ex. 8 | 87.75 | 0.0 | 0.0 | 2.5 | 0.0 | 9.75 | 0.0 | 0.0 | 0.0 | 10.0 | 2.50 | 0.46 | 260 |
| Comp. Ex. 9 | 87.75 | 0.0 | 0.0 | 0.0 | 2.5 | 9.75 | 0.0 | 0.0 | 0.0 | 10.0 | 2.50 | 0.46 | 260 |
| Comp. Ex. 10 | 87.75 | 1.25 | 1.25 | 0.00 | 0.00 | 9.75 | 0.0 | 0.0 | 0.0 | 10.0 | 2.50 | 0.45 | 260 |
| Comp. Ex. 11 | 87.75 | 1.25 | 0.00 | 1.25 | 0.00 | 9.75 | 0.0 | 0.0 | 0.0 | 10.0 | 2.50 | 0.45 | 260 |

TABLE 3-continued

|  | Sintered compact comp. (atomic %) | | | | | | | | | Rate (Atom %) | | Resistivity (mΩcm) | Crystallizaton temp. (° C.) |
|  | In | Ge | Ni | Mn | Al | Sn | Me | Ca | Zn | A | C | | |
| --- | --- | --- | --- | --- | --- | --- | --- | --- | --- | --- | --- | --- | --- |
| Comp. Ex. 12 | 87.75 | 1.25 | 0.00 | 0.00 | 1.25 | 9.75 | 0.0 | 0.0 | 0.0 | 10.0 | 2.50 | 0.46 | 260 |
| Comp. Ex. 13 | 87.75 | 0.00 | 1.25 | 1.25 | 0.00 | 9.75 | 0.0 | 0.0 | 0.0 | 10.0 | 2.50 | 0.46 | 260 |
| Comp. Ex. 14 | 87.75 | 1.25 | 0.00 | 0.00 | 0.00 | 9.75 | 1.25 | 0.00 | 0.0 | 10.0 | 2.50 | 0.46 | 260 |
| Comp. Ex. 15 | 87.75 | 1.25 | 0.00 | 0.00 | 0.00 | 9.75 | 0.00 | 1.25 | 0.0 | 10.0 | 2.50 | 0.46 | 260 |
| Comp. Ex. 16 | 87.75 | 0.00 | 1.25 | 0.00 | 0.00 | 9.75 | 1.25 | 0.00 | 0.0 | 10.0 | 2.50 | 0.46 | 260 |
| Comp. Ex. 17 | 87.75 | 0.0 | 0.0 | 1.25 | 0.00 | 9.75 | 0.00 | 1.25 | 0.0 | 10.0 | 2.50 | 0.46 | 260 |

A: First additive element/(In + First additive element)
C: (Second additive element(s) + Third additive elements))/(In + First additive element + Second additive element(s) + Third additive element(s))

What is claimed is:

1. An oxide sintered compact containing an indium oxide as a main component, while containing tin as a first additive element, and manganese as a second additive element, with the content of tin, which is the first additive element, being 2-15 atom % relative to the total content of indium and tin, and the content of manganese, which is the second additive element, being 0.5-2 atom % relative to the total content of indium, tin and manganese.

2. An oxide sintered compact containing an indium oxide as a main component, while containing tin as a first additive element, one or more elements selected from germanium and manganese as a second additive element, and one or more elements selected from magnesium and calcium as a third additive element, and not containing zinc, with the content of tin which is the first additive element being 2-15 atom % relative to the total content of indium and tin, and the total content of the second additive elements and the third additive elements being 0.1-2 atom % relative to the total content of indium, tin, the second additive elements and the third additive elements.

3. An oxide sintered compact containing an indium oxide as a main component, while containing tin as a first additive element, one or more elements selected from germanium, nickel, and manganese as a second additive element, and calcium as a third additive element, and not containing zinc, with the content of tin which is the first additive element being 2-15 atom % relative to the total content of indium and tin, and the total content of the second additive elements and the third additive element being 0.1-2 atom % relative to the total content of indium, tin, the second additive elements and the third additive element.

4. A method of producing an amorphous film, comprising performing sputtering deposition on a substrate by sputtering a target formed from the oxide sintered compact according to claim 1, 2 or 3, without heating the a substrate.

5. An amorphous film having the same composition as that of the oxide sintered compact according to claim 1, 2 or 3.

6. A method of producing a crystallized film, comprising crystallizing the amorphous film according to claim 5 by annealing the film at a temperature of 160-250° C.

7. A crystallized film having the same composition as that of the oxide sintered compact according to claim 1, 2 or 3.

8. A crystallized film according to claim 7 having resistivity of less than $4.5 \times 10^{-4}$ Ω cm.

* * * * *

UNITED STATES PATENT AND TRADEMARK OFFICE
CERTIFICATE OF CORRECTION

PATENT NO. : 9,028,726 B2  
APPLICATION NO. : 13/063141  
DATED : May 12, 2015  
INVENTOR(S) : Masakatsu Ikisawa et al.

Page 1 of 1

It is certified that error appears in the above-identified patent and that said Letters Patent is hereby corrected as shown below:

In the Claims

Column 16, line 28, please change "the a substrate" to --the substrate--.

Signed and Sealed this  
Third Day of November, 2015

Michelle K. Lee  
*Director of the United States Patent and Trademark Office*